(12) United States Patent
Kim et al.

(10) Patent No.: US 12,031,015 B2
(45) Date of Patent: Jul. 9, 2024

(54) QUATERNARY AMMONIUM-BASED SURFACE MODIFIED SILICA, COMPOSITIONS, METHODS OF MAKING, AND METHODS OF USE THEREOF

(71) Applicant: FUJIMI INCORPORATED, Aichi (JP)

(72) Inventors: Anthony Y. Kim, Tualatin, OR (US); Shogo Onishi, Tigard, OR (US)

(73) Assignee: FUJIMI INCORPORATED, Aichi (JP)

( * ) Notice: Subject to any disclaimer, the term of this patent is extended or adjusted under 35 U.S.C. 154(b) by 29 days.

(21) Appl. No.: 17/706,800

(22) Filed: Mar. 29, 2022

(65) Prior Publication Data

US 2022/0325076 A1    Oct. 13, 2022

Related U.S. Application Data

(60) Provisional application No. 63/168,789, filed on Mar. 31, 2021.

(51) Int. Cl.
*C09G 1/02* (2006.01)
*C08K 9/04* (2006.01)
*H01L 21/306* (2006.01)

(52) U.S. Cl.
CPC .............. *C08K 9/04* (2013.01); *C09G 1/02* (2013.01); *H01L 21/30625* (2013.01)

(58) Field of Classification Search
None
See application file for complete search history.

(56) References Cited

U.S. PATENT DOCUMENTS

| | | |
|---|---|---|
| 10,119,048 B1 | 11/2018 | Guo et al. |
| 10,414,019 B2 | 9/2019 | Sato et al. |
| 2007/0219104 A1* | 9/2007 | Grumbine ............ C09K 3/1463 134/42 |
| 2008/0216709 A1 | 9/2008 | Steingrover et al. |
| 2015/0159046 A1 | 6/2015 | Dinega et al. |
| 2015/0259573 A1 | 9/2015 | Grumbine et al. |
| 2018/0257194 A1* | 9/2018 | Yoshizaki ......... H01L 21/30625 |
| 2018/0290262 A1* | 10/2018 | Sato .................. H01L 21/31058 |
| 2019/0010358 A1* | 1/2019 | Iwata ..................... C09K 13/00 |
| 2019/0316003 A1* | 10/2019 | Kim ...................... C09K 3/1409 |
| 2022/0064489 A1* | 3/2022 | Choi ......................... C09G 1/02 |

FOREIGN PATENT DOCUMENTS

| | | |
|---|---|---|
| JP | 4772156 B1 | 9/2011 |
| JP | 2017505532 A | 2/2017 |
| JP | 2017514927 A | 6/2017 |
| JP | 201929660 A | 2/2019 |
| WO | 2017/057155 A1 | 4/2017 |

* cited by examiner

*Primary Examiner* — Shamim Ahmed
(74) *Attorney, Agent, or Firm* — Katten Muchin Rosenman LLP

(57) ABSTRACT

The present disclosure relates to surface modified silica, where the surface of the silica is modified by a quaternary ammonium-based polymer. Modification of the silica surface in this manner allows for production of silica particles with a high zeta potential and minimal change in particle size.

15 Claims, No Drawings

QUATERNARY AMMONIUM-BASED SURFACE MODIFIED SILICA, COMPOSITIONS, METHODS OF MAKING, AND METHODS OF USE THEREOF

TECHNICAL FIELD

The present disclosure relates to surface modified silica, where the silica is modified by a quaternary ammonium-based polymer. Further, polishing compositions comprising the surface modified silica, and methods for making and using the surface modified silica are provided.

BACKGROUND

Chemical mechanical polishing (CMP) is a process in which material is removed from a surface of a substrate (such as a semiconductor wafer), and the surface is polished (planarized) by coupling a physical process such as abrasion with a chemical process such as oxidation or chelation. In its most rudimentary form, CMP involves applying a slurry to the surface of the substrate or a polishing pad that polishes the substrate. This process achieves both the removal of unwanted material and planarization of the surface of the substrate. It is not desirable for the removal or polishing process to be purely physical or purely chemical, but rather comprise a synergistic combination of both.

The polishing compositions used in the CMP process can be characterized according to its polishing rate (i.e., removal rate) and its planarization efficiency. The polishing rate refers to the rate of removal of a material from the surface of the substrate, and is usually expressed in terms of units of length (thickness) per unit of time (e.g., Angstroms (Å) per minute). Planarization efficiency relates to step height reduction versus amount of material removed from the substrate. Specifically, a polishing surface first contacts the "high points" of the surface and must remove material in order to form a planar surface. A process that results in achieving a planar surface with less removal of material is considered to be more efficient than a process requiring removal of more material to achieve planarity. Further, a surface scratch, which can be generated by CMP, is an extremely detrimental defect in semiconductor manufacturing. Hence, to achieve proper CMP performance without the issues raised above and with a sufficient polishing rate, development of polishing compositions is crucially important.

These polishing compositions comprise several components, such as abrasive grains. The type of abrasive grain has a significant effect on the CMP process, including overall polishing rate and planarization efficiency. Typical abrasive grains include silicon dioxide, cerium oxide, aluminum oxide, zirconium oxide, and tin oxide.

These and other challenges are addressed by the subject matter disclosed herein.

SUMMARY

In accordance with the purpose(s) of the currently disclosed subject matter or problems to be solved by the invention, as embodied and broadly described herein, it is an object of the present invention to provide a surface modified silica comprising silica and a quaternary ammonium-based polymer. Another object of the present invention is to provide a method for polishing a substrate using the surface modified silica comprising silica and a quaternary ammonium-based polymer.

Accordingly, the presently disclosed subject matter in one aspect relates to a surface modified silica comprising silica and a quaternary ammonium-based polymer, wherein the quaternary ammonium-based polymer is represented by a compound of Formula (I):

[Formula 1]

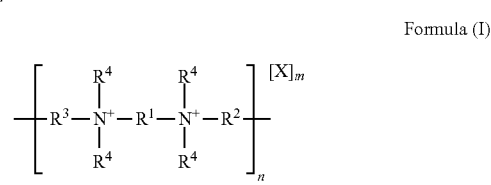

Formula (I)

wherein
$R^1$ is selected from substituted or unsubstituted C1-C8 alkyl, substituted or unsubstituted aryl, substituted heteroaryl, and substituted cycloalkyl,
$R^2$ is selected from substituted or unsubstituted C1-C8 alkyl, substituted or unsubstituted aryl, substituted heteroaryl, and substituted cycloalkyl,
$R^3$ is a substituted or unsubstituted alkyl ether,
$R^4$ is, in each instance, a substituted or unsubstituted C1-C8 alkyl,
X is, in each instance, a counterion,
m is an integer between 1 and 20,000, and
n is an integer between 1 and 10,000.

In another aspect, the subject matter described herein is directed to a polishing composition, wherein the polishing composition comprises the surface modified silica comprising silica and a quaternary ammonium-based polymer and a dispersing medium.

In another aspect, the subject matter described herein is directed to a method for polishing a substrate, the method comprising the steps of: a) providing the polishing composition of the aspect of the present invention; and b) polishing the substrate with the polishing composition to provide a polished substrate.

In still another aspect, the subject matter described herein is directed to a method for preparing a surface modified silica, the method comprising the steps of: a) preparing a dispersion comprising silica and a dispersing medium, and b) adding a quaternary ammonium-based polymer to the dispersion, whereby the surface modified silica is prepared.

These and other aspects are disclosed in further detail below.

DETAILED DESCRIPTION

The present invention can be understood more readily by reference to the following detailed description of the invention and the Examples included therein.

Before the present compounds, compositions, and/or methods are disclosed and described, it is to be understood that they are not limited to specific synthetic methods unless otherwise specified, or to particular components unless otherwise specified, as such may, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

In the present specification, "X to Y" indicating a range refers to "X or more and Y or less". When a plurality of "X to Y" is described, for example, when "X1 to Y1, or X2 to Y2" is described, the disclosure of each number as the upper limits, the disclosure of each number as the lower limits, and the disclosure of the combination of those upper and lower limits are all included (i.e., the lawful basis for the amendment). Specifically, the amendment to X1 or more, amendment to Y2 or less, amendment to X1 or less, amendment to Y2 or more, amendment to X1 to X2, amendment to X1 to Y2, or the like should all be considered legal. Moreover, unless otherwise specified, measurements upon operation and of physical properties etc. are performed under the conditions of room temperature (20-25° C.)/relative humidity of 40-50% RH. Incidentally, the concentration described herein may be a concentration at the point of use (POU) or a concentration before dilution to the POU concentration.

As described herein, in embodiments, are surface modified silica, where the silica is modified by a quaternary ammonium-based polymer. Further, polishing compositions comprising the surface modified silica, and methods for making and using the surface modified silica are provided. The surface modified silica is intended for use in a polishing composition, where the polishing composition may be used in polishing a substrate. The surface modified silica and preparation methods thereof exhibit at least one benefit such as: 1) a high positive surface charge over a broad pH range; and 2) cationization of the silica with only a small change in the particle size.

The zeta potential, average particle size, and polydispersity index are key properties of the surface-modified silica.

The surface modified silica described herein has uses such as, but not limited to, incorporation into a CMP slurry for the chemical mechanical polishing of semiconductor wafers.

A. Definitions

Listed below are definitions of various terms used to describe this invention. These definitions apply to the terms as they are used throughout this specification, unless otherwise limited in specific instances, either individually or as part of a larger group.

As used in the specification and the appended claims, the singular forms "a," "an" and "the" include plural referents unless the context clearly dictates otherwise. Thus, for example, reference to "a particle" or "an alkyl group" includes mixtures of two or more such particles or alkyl groups.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units is also disclosed. For example, if 10 and 15 are disclosed, then 11, 12, 13, and 14 are also disclosed.

References in the specification and concluding claims to parts by weight of a particular element or component in a composition denote the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compositions.

A weight percent (wt %) of a component, unless specifically stated to the contrary, is based on the total weight of the vehicle or composition in which the component is included.

As used herein, the terms "optional" and "optionally" mean that the subsequently described event or circumstance can or cannot occur, and that the description includes instances where said event or circumstance occurs and instances where it does not.

As used herein, the term "alkyl" refers to a straight or branched chain hydrocarbon containing from 1 to 20 carbon atoms. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, n-decyl, and the like. Additional examples are designated by their carbon chain length, such as C2, C4, C6, C8, C10, C12, C14, C16, C18, and C20. These groups may be substituted with groups selected from halo (e.g., haloalkyl), haloalkyl, alkenyl, alkynyl, cycloalkyl, cycloalkylalkyl, aryl, arylalkyl, heterocyclo, heterocycloalkyl, hydroxyl, alkoxy (thereby creating a polyalkoxy such as polyethylene glycol), alkenyloxy, alkynyloxy, haloalkoxy, cycloalkoxy, cycloalkylalkyloxy, aryloxy, arylalkyloxy, heterocyclooxy, heterocyclolalkyloxy, mercapto, carboxy, alkylamino, alkenylamino, alkynylamino, haloalkylamino, cycloalkylamino, cycloalkylalkylamino, arylamino, arylalkylamino, heterocycloamino, heterocycloalkylamino, disubstituted-amino, ester, amide, nitro, or cyano.

The term "alkylene" is a divalent group formed by removing one hydrogen atom from an "alkyl". A representative example of an alkylene includes a divalent form of a representative alkyl.

The term "cycloalkyl" refers to a hydrocarbon 3-8 membered monocyclic or 7-14 membered bicyclic ring system having at least one saturated ring or having at least one non-aromatic ring, wherein the non-aromatic ring may have some degree of unsaturation. Cycloalkyl groups may be optionally substituted with one or more substituents. In one embodiment, 0, 1, 2, 3, or 4 atoms of each ring of a cycloalkyl group may be substituted by a substituent. Representative examples of cycloalkyl group include cyclopropyl, cyclopentyl, cyclohexyl, cyclobutyl, cycloheptyl, cyclopentyl, cyclopentadienyl, cyclohexenyl, cyclohexadienyl, and the like.

The term "cycloalkylene" is a divalent group formed by removing one hydrogen atom from "cycloalkyl." The cycloalkylene group may be optionally substituted with one or more substituents. In one embodiment, 0, 1, 2, 3, or 4 atoms of each ring of the cycloalkylene group may be substituted by a substituent. A representative example of a cycloalkylene group includes a divalent form of a representative example of a cycloalkyl group.

As used herein, the term "heteroaryl" or "heteroaromatic" refers to a monovalent aromatic radical of 5- or 6-membered rings, and includes fused ring systems (at least one of which is aromatic) of 5-20 atoms, containing one or more heteroatoms independently selected from nitrogen, oxygen, and sulfur. Examples of heteroaryl groups are pyridinyl (including, for example, 2-hydroxypyridinyl), imidazolyl, imidazopyridinyl, pyrimidinyl (including, for example, 4-hydroxypyrimidinyl), pyrazolyl, triazolyl (including, for example, 3-amino-1,2,4-triazole or 3-mercapto-1,2,4-triazole), pyrazinyl (including, for example, aminopyrazine), tetrazolyl, furyl, thienyl, isoxazolyl, thiazolyl, oxadiazolyl, oxazolyl, isothiazolyl, pyrrolyl, quinolinyl, isoquinolinyl, tetrahydroisoquinolinyl, indolyl, benzimidazolyl, benzofuranyl, cinnolinyl, indazolyl, indolizinyl, phthalazinyl, pyridazinyl, triazinyl, isoindolyl, pteridinyl, purinyl, oxadiazolyl, triazolyl, thiadiazolyl, furazanyl, benzofurazanyl, benzothiophenyl, benzothiazolyl, benzoxazolyl, quinazolinyl, quinoxalinyl, naphthyridinyl, and furopyridinyl. The heteroaryl groups are thus, in some embodiments, monocyclic or bicyclic. Heteroaryl groups are optionally substituted independently with one or more substituents described herein.

The term "heteroarylene" is a divalent group formed by removing one hydrogen atom from "heteroaryl." Examples of heteroarylene groups include divalent forms of examples of heteroaryl groups. The heteroarylene group is, in some embodiments, a monocyclic or bicyclic. The heteroarylene group is optionally substituted with one or more substituents described herein independently.

As used herein, the term "aryl" refers to a hydrocarbon monocyclic, bicyclic or tricyclic aromatic ring system. Aryl groups may be optionally substituted with one or more substituents. In one embodiment, 0, 1, 2, 3, 4, 5 or 6 atoms of each ring of an aryl group may be substituted by a substituent. Examples of aryl groups include phenyl, naphthyl, anthracenyl, fluorenyl, indenyl, azulenyl, and the like.

The term "arylene" refers to a divalent group of a monocyclic, bicyclic, or tricyclic aromatic ring system of hydrocarbons. The arylene group may optionally be substituted with one or more substituents. In one embodiment, 0, 1, 2, 3, 4, 5, or 6 atoms of each ring of the arylene group may be substituted by a substituent. Examples of arylene groups include divalent forms of examples of aryl groups.

As used herein, the term "substituted" refers to a moiety (such as an alkyl group), wherein the moiety is bonded to one or more additional organic radicals. In some embodiments, the substituted moiety comprises 1, 2, 3, 4, or 5 additional substituent groups or radicals. Suitable organic substituent radicals include, but are not limited to, hydroxyl, amino, mono-substituted amino, di-substituted amino, mercapto, alkylthiol, alkoxy, substituted alkoxy or haloalkoxy radicals, wherein the terms are defined herein. Unless otherwise indicated herein, the organic substituents can comprise from 1 to 4 or from 5 to 8 carbon atoms. When a substituted moiety is bonded thereon with more than one substituent radical, then the substituent radicals may be the same or different.

As used herein, the term "alkoxy", used alone or as part of another group, means the radical —OR, where R is an alkyl group as defined herein.

As used herein, the term "halo" refers to any suitable halogen, including —F, —Cl, —Br, and —I.

As used herein, the term "mercapto" refers to an —SH group.

As used herein, the term "cyano" refers to a —CN group.

As used herein, the term "carboxylic acid" refers to a —C(O)OH group.

As used herein, the term "hydroxyl" refers to an —OH group.

As used herein, the term "nitro" refers to an —NO$_2$ group.

As used herein, the terms "ether" and "alkylether" are represented by the formula R$_a$—O—R$_b$, where R$_a$ and R$_b$ can be, independently, an alkyl, cycloalkyl, alkenyl, cycloalkenyl, alkynyl, cycloalkynyl, aryl, or heteroaryl group as described herein. The term "polyether" as used herein is represented by the formula —(R$_a$—O—R$_b$)$_x$—, where R$_a$ and R$_b$ can be, independently, an alkyl, cycloalkyl, alkenyl, cycloalkenyl, alkynyl, cycloalkynyl, aryl, or heteroaryl group described herein and "x" is an integer from 1 to 500. Examples of polyether groups include polyethylene oxide, polypropylene oxide, and polybutylene oxide.

As used herein, the term "oxyalkylene" refers to —OR—, wherein R is alkylene as defined herein.

As used herein, the term "acyl", used alone or as part of another group, refers to a —C(O)R radical, where R is any suitable substituent such as aryl, alkyl, alkenyl, alkynyl, cycloalkyl or other suitable substituent as described herein.

As used herein, the term "alkylthio", used alone or as part of another group, refers to an alkyl group, as defined herein, appended to the parent molecular moiety through a thiol moiety, as defined herein.

Representative examples of alkylthio include, but are not limited, methylthio, ethylthio, tert-butylthio, hexylthio, and the like.

As used herein, the term "amino" means the radical —NH$_2$.

As used herein, the term "alkylamino" or "mono-substituted amino", used alone or as part of another group, means the radical —NHR, where R is an alkyl group as defined herein.

As used herein, the term "disubstituted amino", used alone or as part of another group, means the radical —NR$_a$R$_b$, where R$_a$ and R$_b$ are independently selected from the groups alkyl, haloalkyl, alkenyl, alkynyl, cycloalkyl, cycloalkylalkyl, aryl, arylalkyl, heterocyclo, and heterocycloalkyl, which are as defined herein.

As used herein, the term "ester", used alone or as part of another group, refers to a —C(O)OR radical, where R is any suitable substituent such as alkyl, cycloalkyl, alkenyl, alkynyl or aryl, which are as defined herein.

As used herein, the term "amide", used alone or as part of another group, refers to a —C(O)NR$_a$R$_b$ radical, where R$_a$ and R$_b$ are any suitable substituent such as alkyl, cycloalkyl, alkenyl, alkynyl or aryl.

As used herein, the term "unsubstituted" refers to a moiety (such as an alkyl group) that is not bonded to one or more additional organic or inorganic substituent radical as described above, meaning that such a moiety is only substituted with hydrogens.

As used herein, the term "monocyclic" refers to a molecular structure that contains a single ring of atoms such as, for example, benzene or cyclopropane.

As used herein, the term "bicyclic" refers to a molecular structure that contains two rings of atoms that are fused together such as, for example, naphthalene.

As used herein, the term "counterion" refers to an ion having a charge opposite to that of the substance with which it is associated. The counterion may be any organic or inorganic moiety that stabilizes the charge on the parent compound. The counterions may have a positive or negative charge. Non-limiting examples of counterions include halide ions (e.g., F$^-$, Cl$^-$, Br$^-$, I$^-$), NO$_3^-$, ClO$_4^-$, OH$^-$, H$_2$PO$_4^-$, HCO$_3^-$, HSO$_4^-$, sulfonate ions (e.g., methanesulfonate, trifluoromethanesulfonate, p-toluenesulfonate, benzenesulfonate, 10-camphor sulfonate, naphthalene-2-sulfonate, naphthalene-1-sulfonic acid-5-sulfonate, ethan-1-sulfonic acid-2-sulfonate, and the like), carboxylate ions (e.g., acetate, propanoate, benzoate, glycerate, lactate, tartrate, glycolate, gluconate, and the like), BF$_4^-$, PF$_4^-$, PF$_6^-$, AsF$_6^-$, and $SbF_6^-$. Non-limiting examples of counterions which may be multivalent include $CO_3^{2-}$, $HPO_4^{2-}$, $PO_4^{3-}$, $B_4O_7^{2-}$, $SO_4^{2-}$, $S_2O_3^{2-}$, carboxylate anions (e.g., tartrate, citrate, fumarate, maleate, malate, malonate, gluconate, succinate, glutarate, adipate, pimelate, suberate, azelate, sebacate, salicylate, phthalates, aspartate, glutamate, and the like), and carboranes.

A positive counterion may be mono- (e.g. an alkali metal or ammonium), di- (e.g. an earth-alkali metal) or tri-valent (e.g. aluminium). Non-limiting examples of positive counterions are alkali metal cations, such as $Li^+$, $Na^+$, or $K^+$.

B. Surface Modified Silica

The present disclosure relates to surface modified silica, where the surface of the silica is modified by a quaternary ammonium-based polymer. Modification of the silica surface in this manner allows for production of silica particles with a high zeta potential and minimal change in particle size.

The fundamental mechanism of chemical mechanical polishing (CMP) is to soften a surface layer by chemical reaction and then remove the softened layer by mechanical force with abrasive grains. However, the role of CMP is not only material removal, but also planarization, surface smoothening, uniformity control, defect reduction and more. Semiconductor yield enhancement is thus influenced by CMP processing. A surface scratch, which can be generated by CMP, is an extremely detrimental defect in semiconductor manufacturing. Hence, to achieve proper CMP performance without surface scratches, development of polishing compositions is crucially important. Requirements for CMP may include planarized surfaces with planarity<15 nm, roughness free surfaces with surface roughness<1 nm, defect free surfaces with scratches and pit counts of 0 counts per wafer, are contamination free, have a high productivity, and are desirably planarized with a high removal rate of the desired material to be removed.

The surface modified silica and preparation methods thereof exhibit at least one benefit such as: 1) a high positive surface charge over a broad pH range; and 2) cationization of the silica with only a small change in the particle size.

1. Quaternary Ammonium-Based Polymer

The presently disclosed subject matter in one aspect relates to a surface modified silica comprising silica and a quaternary ammonium-based polymer, wherein the quaternary ammonium-based polymer is represented by a compound of Formula (I):

[Formula 2]

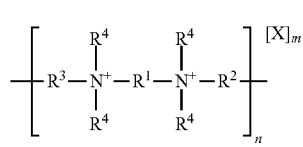

Formula (I)

wherein
$R^1$ is selected from substituted or unsubstituted C1-C8 alkylene, substituted or unsubstituted arylene, substituted or unsubstituted heteroarylene, and substituted or unsubstituted cycloalkylene,
$R^2$ is selected from substituted or unsubstituted C1-C8 alkylene, substituted or unsubstituted arylene, substituted or unsubstituted heteroarylene, and substituted or unsubstituted cycloalkylene,
$R^3$ is substituted or unsubstituted C1-C8 alkylene or a substituted or unsubstituted oxyalkylene,
$R^4$ is each independently a substituted or unsubstituted C1-C8 alkyl,
X is, in each instance, a counterion,
m is an integer between 1 and 20,000, and
n is an integer between 1 and 10,000.

In some embodiments, $R^1$ is unsubstituted C1-C8 alkylene. In some embodiments, $R^1$ is unsubstituted C1-C4 alkylene. In some embodiments, $R^1$ is unsubstituted C1-C3 alkylene. In some embodiments, $R^1$ is —$CH_2$— or —$CH_2CH_2$—. In some embodiments, $R^1$ is —$CH_2CH_2$—.

In some embodiments, $R^2$ is unsubstituted C1-C8 alkylene. In some embodiments, $R^2$ is unsubstituted C1-C4 alkylene. In some embodiments, $R^2$ is unsubstituted C1-C3 alkylene. In some embodiments, $R^2$ is —$CH_2$— or —$CH_2CH_2$—. In some embodiments, $R^2$ is —$CH_2CH_2$—.

In some embodiments, $R^3$ is methylene, ethylene, propylene, butylene, isopropylene, or isobutylene. In some embodiments, $R^4$ is methyl.

In some embodiments, $R^3$ is unsubstituted oxyalkylene. In some embodiments, $R^3$ is —O—(C1-C8 alkylene)-. In some embodiments, $R^3$ is —O—(C1-C4 alkylene)-. In some embodiments, $R^3$ is —O—(C1-3 alkylene)-. In some embodiments, $R^3$ is —O—(C1 or C2 alkylene)-. In some embodiments, $R^3$ is —$OCH_2CH_2$—. In other embodiments, $R^3$ is a polyether represented by the formula —$(R_a$—O—$R_b)_x$—, where $R_a$ and $R_b$ can be, independently, C1-C8 alkylene or arylene and "x" is an integer from 1 to 500. In some embodiments, $R_a$ and $R_b$ are each —$CH_2$—.

In some embodiments, $R^4$ is each independently unsubstituted C1-C4 alkyl. In some embodiments, $R^4$ is each independently methyl, ethyl, propyl, butyl, isopropyl, or isobutyl. In some embodiments, $R^4$ is methyl.

Without being bound by theory, the large number of C facilitates aggregation of abrasive grains due to higher hydrophobicity of the cation polymer. Moreover, this causes a steric hindrance between the N atoms for accessing the surface of the silica abrasive grains, which may inhibit adsorption itself. Therefore, the number of C in $R^1$ to $R^4$ is preferably as small as possible. Hence $R^4$ that is methyl or ethyl is preferred.

In some embodiments, $R^1$ and $R^2$ are —$CH_2CH_2$—, $R^3$ is —$OCH_2CH_2$—, and $R^4$ is methyl. Accordingly, in some embodiments, the quaternary ammonium-based polymer is represented by a compound of Formula (II):

[Formula 3]

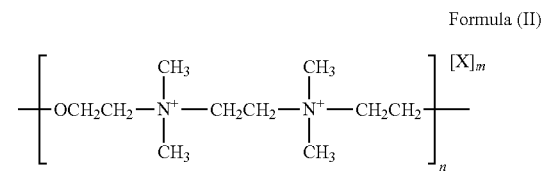

Formula (II)

wherein X, n, and m are defined as above. In a further embodiment, X is $Cl^-$ or $OH^-$.

In some embodiments, in the compound of Formula (II), X is $Cl^-$, and n and m are integers sufficient that the overall molecular weight is about 5,000 g/mol. As described further herein, this compound is also referred to as POEDMIED2C. This compound is also known as poly[oxyethylene(dimethyliminio)ethylene-(dimethyliminio)ethylene dichloride], polyquaternium WSCP, or EBC 1.

In some embodiments, n is an integer selected from 1-10,000, for example, from 1-5,000, 1-1,000, 1-500, 1-250, 1-100, or 1-50. In some embodiments, n is in a range from 50-150, from 25-300, or from 10-500.

In some embodiments, m is an integer selected from 1-20,000, for example, from 1-10,000, 1-5,000, 1-1,000, 1-500, 1-250, 1-100, 1-50, 2-40, 3-30, or 4-20. In some embodiments, m is in a range from 50-150, from 25-300, or from 10-500. In some embodiments, m is an integer selected from 2-10,000, 2-2,000, 2-1,000, 2-500, 2-100, 4-80, 6-60, 8-40, or 4-20.

In some embodiments, n and m are related such that m=2n.

In some embodiments, the average molecular weight of the quaternary ammonium-based polymer is in the range from about 500 g/mol to about 200,000 g/mol, from about 1,000 g/mol to about 50,000 g/mol, from about 1,500 g/mol to about 25,000 g/mol, from about 2,000 g/mol to about 15,000 g/mol, from about 2,500 g/mol to about 10,000 g/mol, from about 3,000 g/mol to about 8,000 g/mol, from 3,500 g/mol to about 7,000 g/mol, or from 4,000 g/mol to about 5,000 g/mol. In some embodiments, the average molecular weight of the quaternary ammonium-based polymer is less than about 100,000 g/mol, less than about 50,000 g/mol, less than about 25,000 g/mol, or less than about 10,000 g/mol. In some embodiments, the average molecular weight of the quaternary ammonium-based polymer is about 2,500 g/mol, about 5,000 g/mol, about 10,000 g/mol, about 25,000 g/mol, about 50,000 g/mol, or about 100,000 g/mol.

In some embodiments, the average molecular weight may be measured by gel permeation chromatography (GPC) using polystyrene of known molecular weight as a reference material. In some embodiments, the average molecular weight can be a weight-average molecular weight.

In some embodiments, X is a negatively charged counterion that is known in the art. For example, X can be, in each instance, at least one selected from the group consisting of the halide ions (e.g., $F^-$, $Cl^-$, $Br^-$, $I^-$), $NO_3^-$, $ClO_4^-$, $OH^-$, $H_2PO_4^-$, $HCO_3^-$, $HSO_4^-$, sulfonate ions (e.g., methanesulfonate, trifluoromethanesulfonate, p-toluenesulfonate, benzenesulfonate, 10-camphor sulfonate, naphthalene-2-sulfonate, naphthalene-1-sulfonic acid-5-sulfonate, ethan-1-sulfonic acid-2-sulfonate, and the like), carboxylate ions (e.g., acetate, propanoate, benzoate, glycerate, lactate, tartrate, glycolate, gluconate, and the like), $BF_4^-$, $PF_4^-$, $PF_6^-$, $AsF_6^-$, and $SbF_6^-$. Non-limiting examples of counterions which may be multivalent include $CO_3^{2-}$, $HPO_4^{2-}$, $PO_4^{3-}$, $B_4O_7^{2-}$, $SO_4^{2-}$, $S_2O_3^{2-}$, carboxylate anions (e.g., tartrate, citrate, fumarate, maleate, malate, malonate, gluconate, succinate, glutarate, adipate, pimelate, suberate, azelate, sebacate, salicylate, phthalates, aspartate, glutamate, and the like), and carboranes. In some embodiments, X is, in each instance, independently selected from the group consisting of hydroxide, halide, nitrate, carbonate, sulfate, phosphate, and acetate. In some embodiments, X is hydroxide or halide ion.

As in any embodiment above, a surface modified silica wherein the quaternary ammonium-based polymer has a molecular weight between about 2,000 g/mol and about 15,000 g/mol, is provided.

2. Silica (Silica Particle)

The surface modified silica comprises silica. In an embodiment, the silica is favorably colloidal silica. Examples of a method for producing colloidal silica include the soda silicate method and the sol-gel method, both of which are known in the art. Colloidal silica produced by either of these methods can be suitably used as the silica in the present invention. However, from the viewpoint of reducing metal impurities, colloidal silica produced by the sol-gel method, which allows for production of colloidal silica with high purity, is preferred. In some embodiments, the silica (silica particles) may be in the form of an aqueous dispersion.

3. Methods for Making the Surface Modified Silica

The present disclosure relates to surface modified silica, where the surface of the silica is modified by a quaternary ammonium-based polymer. Modification of the silica surface in this manner allows for production of silica particles with a high zeta potential and minimal change in particle size.

Further, the production of surface modified silica described herein has advantages when compared to prior methods (for example, disclosed in Japanese Patent Laid-Open 2012-040671) for producing surface modified abrasive grains. These advantages include fewer steps in production of the surface modified silica and the like, for example, from the viewpoint of completion of modification only by mixing the quaternary ammonium-based polymer in the present invention.

In some embodiments, the surface modified silica can be in the form of an aqueous dispersion.

The surface modified silica can be produced quickly and economically. Further, the particle size for the surface modified silica is not significantly changed from the size of the silica particle before modification.

The surface modified silica can have an average secondary particle size of about 10 nm or more, about 25 nm or more, about 50 nm or more, about 60 nm or more, or about 70 nm or more. Alternatively, or in addition, the abrasive grain can have an average secondary particle size of about 500 nm or less, about 200 nm or less, about 150 nm or less, about 100 nm or less, about 90 nm or less, about 80 nm or less, about 70 nm or less, or about 60 nm or less. For example, in embodiments, the abrasive grain can have an average secondary particle size in a range from about 10 nm to about 500 nm, from about 25 nm to about 250 nm, from about 50 nm to about 100 nm, or from about 60 nm to about 80 nm. In some embodiments, the average secondary particle size is about 50 nm, about 60 nm, about 70 nm, about 80 nm, or about 90 nm.

Preferred embodiments for secondary particle size ranges include a range from about 50 nm to about 100 nm, or from about 60 nm to about 80 nm. A more preferred range is from about 60 nm to about 80 nm. When the average secondary particle size is within this preferred range, surface defects such as scratches on a surface of a substrate can be suppressed.

The average secondary particle size of the surface modified silica can be measured by dynamic light scattering (DLS). As used herein, the average secondary particle size is also referred to as "z-avg size."

In the particle size distribution analysis by the dynamic light scattering method, the polydispersity index (PDI) is another measurement that is widely used. As a general description, the larger the values for the PDI, the larger the size distribution of the particle size. Accordingly, lower values for PDI are preferred. In some embodiments, the PDI for the surface modified silica is in a range from about 0 to about 0.20, from about 0 to about 0.10, or from about 0 to about 0.05. Alternatively, the PDI is in a range from about 0.01 to about 0.20, from about 0.025 to about 0.15, or from about 0.05 to about 0.10. In some embodiments, the PDI is less than about 0.15, less than about 0.10, less than about 0.75, less than about 0.70, or less than about 0.50. In some embodiments, the polydispersity index (PDI) may employ a value measured by a Zetasizer manufactured by Malvern Panalytical Ltd. The polydispersity index (PDI) may be calculated by the apparatus automatically at the same time as the particle size.

The surface modified silica particles have a permanent positive charge. The charge on such particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein).

Accordingly, the surface modified silica described herein has an associated zeta potential. In an embodiment, the surface modified silica has a positive zeta potential. In some embodiments, the surface modified silica has a positive zeta potential when in the polishing composition. The positive zeta potential may be in the range from about 10 mV to about 90 mV, from about 20 mV to about 80 mV, from about 30 mV to about 70 mV, or from about 40 mV to about 60 mV. In some embodiments, the zeta potential is about 30 mV, about 35 mV, about 40 mV, about 45 mV, about 50 mV, about 55 mV, about 60 mV, about 65 mV, or about 70 mV. In some embodiments, the zeta potential is greater than about 20 mV, greater than about 30 mV, greater than about 40 mV, or greater than about 50 mV. In some embodiments, the zeta potential may employ a value measured with a Zetasizer manufactured by Malvern Panalytical Ltd.

The surface modified silica may have an associated electrical conductivity (EC). The electrical conductivity for the surface modified silica described herein is from greater than zero to about 1.0 mS/cm. In some embodiments, the electrical conductivity is from greater than zero to about 0.75 mS/cm, from greater than zero to about 0.50 mS/cm, from greater than zero to about 0.25 mS/cm, from greater than zero to about 0.15 mS/cm, from greater than zero to about 0.10 mS/cm, from greater than zero to about 0.05 mS/cm, or from greater than zero to about 0.03 mS/cm. In some embodiments, the electrical conductivity is from about 0.01 mS/cm to about 1.0 mS/cm, from about 0.02 mS/cm to about 0.50 mS/cm, or from about 0.03 mS/cm to about 0.1 mS/cm. In some embodiments, the electrical conductivity is about 0.02, 0.03, 0.04, 0.05, 0.06, 0.07, 0.08, 0.09, 0.10, 0.11, 0.12, 0.13, 0.14, or 0.15 mS/cm. In some embodiments, the upper limit of the electrical conductivity is about 0.25 mS/cm, about 0.20 mS/cm, about 0.18 mS/cm, about 0.16 mS/cm, about 0.14 mS/cm, about 0.12 mS/cm, about 0.10 mS/cm, about 0.08 mS/cm, about 0.07 mS/cm, about 0.06 mS/cm, about 0.05 mS/cm, about 0.04 mS/cm, or about 0.03 mS/cm. In some embodiments, the electrical conductivity may employ a value measured with an Orion Star A212 manufactured by Thermo Fisher Scientific Inc. Incidentally, the electrical conductivity of the surface modified silica may be an electrical conductivity of an aqueous dispersion of the surface modified silica.

The surface modified silica particles described herein may be further characterized by the relationship between the quaternary ammonium-based polymer molecules relative to the silica particles. This relationship is represented herein as ($N^+/N^-$). The higher this number indicates a more complete coating of the silica particle.

Accordingly, in some embodiments, the $N^+/N^-$ value is about 500 or greater, greater than about 500, greater than about 1,000, greater than about 2,000, greater than about 3,000, greater than about 4,000, greater than about 5,000, greater than about 6,000, or greater than about 7,000. In alternate embodiments, the $N^+/N^-$ value is about 500, about 1,000, about 2,500, about 5,000, or about 7,000.

As described herein, in some embodiments, is a surface modified silica comprising silica and a quaternary ammonium-based polymer, wherein the quaternary ammonium-based polymer is represented by a compound of Formula (I):

[Formula 4]

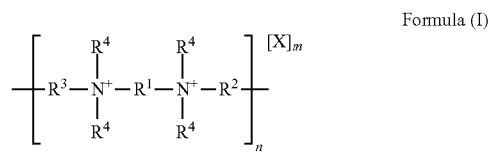

Formula (I)

wherein $R^1$ is selected from substituted or unsubstituted C1-C8 alkylene, substituted or unsubstituted arylene, substituted or unsubstituted heteroarylene, and substituted or unsubstituted cycloalkylene, $R^2$ is selected from substituted or unsubstituted C1-C8 alkylene, substituted or unsubstituted arylene, substituted or unsubstituted heteroarylene, and substituted or unsubstituted cycloalkylene, $R^3$ is a substituted or unsubstituted oxyalkylene, $R^4$ is each independently a substituted or unsubstituted C1-C8 alkyl, X is, in each instance, a counterion, m is an integer between 1 and 20,000, and n is an integer between 1 and 10,000.

As in any embodiment above, a surface modified silica wherein X is each independently selected from the group consisting of hydroxide, halide, nitrate, carbonate, sulfate, phosphate, and acetate, is provided.

As in any embodiment above, a surface modified silica wherein $R^1$ and $R^2$ are each independently substituted or unsubstituted C1-C8 alkylene, and $R^4$ is each independently substituted or unsubstituted C1-C8 alkyl, is provided. In a further embodiment, $R^1$ and $R^2$ are each independently unsubstituted C1-C4 alkylene or unsubstituted C1-C3 alkylene, and $R^4$ is each independently unsubstituted C1-C4 alkyl, unsubstituted C1-C3 alkyl or unsubstituted C1 or unsubstituted C2 alkyl. In a still further embodiment, $R^1$ and $R^2$ are —CH$_2$CH$_2$—.

As in any embodiment above, a surface modified silica wherein $R^4$ is methyl, is provided.

As in any embodiment above, a surface modified silica wherein $R^3$ is an unsubstituted oxyalkylene, is provided.

As in any embodiment above, a surface modified silica wherein $R^3$ is —OCH$_2$CH$_2$—, is provided.

As in any embodiment above, a surface modified silica wherein $R^3$ is a polyether represented by the formula —(R$_a$—O—R$_b$)$_x$—, where R$_a$ and R$_b$ can be, independently, C1-C8 alkylene or arylene and "x" is an integer from 1 to 500, is provided.

As in any embodiment above, a surface modified silica wherein $R^1$ and $R^2$ are —CH$_2$CH$_2$—, $R^3$ is —OCH$_2$CH$_2$—, $R^4$ is methyl, and X is hydroxide or a halide ion, is provided.

As in any embodiment above, a surface modified silica wherein the surface modified silica has an average secondary particle size between about 60 nm and about 80 nm, is provided.

As in any embodiment above, a surface modified silica wherein the surface modified silica has a polydispersity index of about 0.07 or less, is provided.

As in any embodiment above, a surface modified silica wherein the surface modified silica has a zeta potential between about 30 mV and about 70 mV, is provided.

As in any embodiment above, a surface modified silica wherein the surface modified silica has an electrical conductivity from greater than zero to about 0.25 mS/cm, is provided.

As in any embodiment above, a surface modified silica wherein $N^+/N^-$ is 500 or greater or greater than 500, is provided.

Additionally, as described herein, in some embodiments, are methods of preparing a surface modified silica, the method comprising the steps of: a) providing (for example, preparing) a dispersion comprising silica and a dispersing medium, and b) mixing a quaternary ammonium-based polymer and the dispersion, whereby the surface modified silica is prepared, wherein the quaternary ammonium-based polymer is a compound of Formula (I):

[Formula 5]

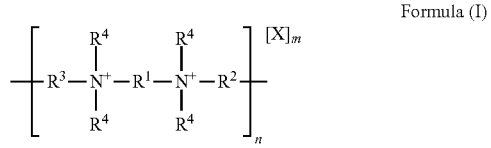

Formula (I)

wherein $R^1$ is selected from substituted or unsubstituted C1-C8 alkylene, substituted or unsubstituted arylene, substituted or unsubstituted heteroarylene, and substituted or unsubstituted cycloalkylene, $R^2$ is selected from substituted or unsubstituted C1-C8 alkylene, substituted or unsubstituted arylene, substituted or unsubstituted heteroarylene, and substituted or unsubstituted cycloalkylene, $R^3$ is a substituted or unsubstituted oxyalkylene, $R^4$ is each independently a substituted or unsubstituted C1-C8 alkylene, X is, in each instance, a counterion, m is an integer between 1 and 20,000, and n is an integer between 1 and 10,000. The variables groups $R^1$, $R^2$, $R^3$, $R^4$, X, n, and m are as defined above. The quaternary ammonium-based polymer may be in the form of an aqueous solution. In this case, the concentration of the quaternary ammonium-based polymer may be, for example, 0.1-0.5 wt %.

As in any embodiment above, a method further comprising adding an electrolyte to the dispersion, is provided. Addition of the electrolyte provides a method for controlling the particle size upon cationization. Lists of electrolytes are provided throughout this application and may be used in the preparation of the surface modified silica. Non-limiting examples of electrolytes include potassium nitrate, sodium chloride, magnesium sulfate, ammonium nitrate, calcium chloride, sodium hydroxide, sodium acetate, magnesium hydroxide, and combinations thereof. In an embodiment, the electrolyte is potassium nitrate.

A mixing of silica and quaternary ammonium-based polymer is preferably conducted in such a way that the concentrations of silica and quaternary ammonium-based polymer in the polishing composition are the same as those in C-1 Polishing Compositions or those in C-2 Polishing Compositions (Another Embodiment).

As in any embodiment above, a method wherein the dispersing medium is water, is provided.

As in any embodiment above, a method wherein the dispersion comprising the silica, quaternary ammonium-based polymer, and dispersing medium are mixed at a speed of about 300 RPM or higher or about 500 RPM or higher, is provided. In some embodiments, the lower limit of the mixing speed is favorably about 200 RPM or higher, about 250 RPM or higher, or about 300 RPM or higher. The upper limit thereof may be about 600 RPM or lower, about 500 RPM or lower, about 450 RPM or lower, or 400 RPM or lower.

C-1. Polishing Compositions

The present disclosure relates to surface modified silica, where the surface of the silica is modified by a quaternary ammonium-based polymer. The surface modified silica may be used in the preparation of a polishing composition, where the polishing composition may further comprise a dispersing medium.

The polishing compositions disclosed herein contain surface modified silica in which a quaternary ammonium-based polymer is modified (physically adsorbed) on the surface of the silica. By using a polishing composition comprising a quaternary ammonium-based polymer modified silica, and polishing a substrate, it is possible that the substrate is polished at a higher speed compared to using unmodified silica, and an effect of fewer defects and scratches will be expected.

1. Components of Polishing Composition

In some embodiments, the polishing compositions comprises a dispersing medium. In some embodiments, the dispersing medium is water. Ion exchanged water (deionized water), pure water, ultrapure water, distilled water and the like may be used as the water. In order to reduce the amount of unwanted components present in the water, the purity of water may be increased by operations such as removal of impurity ions with an ion exchange resin, removal of contaminants with a filter, and/or distillation.

In some embodiments, the water is relatively free of impurities. In some embodiments, the water contains less than about 10% w/w, about 9% w/w, about 8% w/w, about 7% w/w, about 6% w/w, about 5% w/w, about 4% w/w, about 3% w/w, about 2% w/w, about 1% w/w, about 0.9% w/w, about 0.8% w/w, about 0.7% w/w, about 0.6% w/w, about 0.5% w/w, about 0.4% w/w, about 0.3% w/w, or less than about 0.1% w/w of impurities based on the total weight of the water. Here, the impurity includes, for example, Na, Ca, Ni, Fe, Al, and the like. In some embodiments, the dispersing medium may contain solvents other than water, but of the dispersing medium, 80 wt % or more, 90 wt % or more, 95 wt % or more, or 99 wt % or more is preferably water.

pH Adjusting Agent

In some embodiments, the polishing composition according to the present invention contains at least one pH adjusting agent to control the pH. In an embodiment, the pH adjusting agent is a basic compound. The basic compound may be appropriately selected from various basic compounds that have a function of raising the pH of polishing compositions in which the compounds are dissolved. For example, an inorganic basic compound such as an alkali metal hydroxide, an alkaline earth metal hydroxide, various carbonates, bicarbonates and the like may be used. Such basic compounds may be used singly or in combination of two or more types thereof.

Specific examples of the alkali metal hydroxide include potassium hydroxide, sodium hydroxide, ammonium hydroxide, and the like. Specific examples of the carbonate and bicarbonate include ammonium hydrogen carbonate, ammonium carbonate, potassium hydrogen carbonate, potassium carbonate, sodium hydrogen carbonate, sodium carbonate and the like.

In alternate embodiments, the pH adjusting agent may be acidic in nature. The choice of acid is not particularly limited provided that the strength of the acid is sufficient to lower the pH of the polishing composition of the present invention.

The acidic pH adjuster may be an inorganic acid or an organic acid. For example, and without limitation, such inorganic acids include hydrochloric acid, sulfuric acid, nitric acid, boric acid, carbonic acid, hypophosphorous acid, phosphorous acid, and phosphoric acid, as well as salts thereof.

For example, and without limitation, such organic acids include formic acid, acetic acid, chloroacetic acid, propionic acid, butanoic acid, valeric acid, 2-methylbutyric acid, N-hexanoic acid, 3,3-dimethylbutanoic acid, 2-ethylbutanoic acid, 4-methylpentanoic acid, n-heptanoic acid, 2-methyl hexanoic acid, n-octanoic acid, 2-ethylhexanoic acid, benzoic acid, glycolic acid, salicylic acid, glyceric acid, oxalic acid, malonic acid, maleic acid, succinic acid, glutaric acid, adipic acid, pimelic acid, maleic acid, phthalic acid, malic acid, tartaric acid, citric acid, lactic acid, diglycolic acid, isethionic acid, 2-furancarboxylic acid, 3-furancarboxylic acid, 2-tetrahydro furancarboxylic acid, methoxy acetic acid, methoxyphenyl acetic acid, and phenoxyacetic acid, as well as salts thereof. Such organic acids also include, without limitation, organic sulfonic acid, such as methanesulfonic acid, ethane sulfonic acid, and isethionic acid.

The pH adjusting agent may be a mixture of an acidic agent and basic agent (such as a buffer).

In an embodiment, the pH of the polishing vehicle or polishing composition is adjusted to a range that is from about 2.0 to about 10.0, from about 4.0 to about 10.0, from about 5.0 to about 9.0, or from about 6.0 to about 8.0. In some embodiments, the pH is less than about 10.0, less than about 9.0, less than about 8.0, less than about 7.0, less than about 6.0, less than about 5.5, less than about 5.0, less than about 4.5, or less than about 4.0. In some embodiments, the pH is about 3.5, 4.0, 4.5, 5.0, 5.5, 6.0, 6.5, 7.0, 7.5, 8.0, 8.5, 9.0, 9.5, or about 10.0. In some embodiments, the pH is more than about 4.0, more than about 5.0, more than about 6.0, more than about 7.0, more than about 8.0, or more than about 9.0. In some embodiments, the pH measured with an Orion Star A214 manufactured by Thermo Fisher Scientific Inc., may be employed.

The pH adjusting agent may be present at a specific concentration range, regardless of pH. For example, in some embodiments the amount of pH adjusting agent is in a range from about 0.0001 wt % to about 1 wt %, from about 0.005 wt % to about 0.5 wt %, or from about 0.001 wt % to about 0.1 wt %. In some embodiments, the amount of pH adjusting agent is present in an amount of at least about 0.0001 wt %, at least about 0.0005 wt %, at least about 0.001 wt %, at least about 0.005 wt %, at least about 0.01 wt %, at least about 0.025 wt %, at least about 0.05 wt %, at least about 0.075 wt %, or at least about 0.1 wt %. In some embodiments, the pH adjusting agent is present in an amount of less than about 1 wt %, less than about 0.5 wt %, less than about 0.1 wt %, less than about 0.01 wt %, less than about 0.005 wt %, less than about 0.001 wt %, or less than about 0.0005 wt %. In some embodiments, the pH adjusting agent is present in an amount that is about 0.0001 wt %, about 0.00025 wt %, about 0.0005 wt %, about 0.0006 wt %, about 0.0007 wt %, about 0.0008 wt %, about 0.0009 wt %, about 0.001 wt %, about 0.005 wt %, about 0.0075 wt %, about 0.01 wt %, about 0.025 wt %, about 0.05 wt %, about 0.1 wt %, about 0.5 wt %, or about 1 wt %. In some embodiments, the composition (or vehicle) does not contain a pH adjusting agent or contains it in such an amount that the electrical conductivity (EC) is less than 0.15 mS/cm, less than 0.1 mS/cm, or less than 0.05 mS/cm.

In some embodiments, the pH adjusting agent may also serve as an electrolyte.

Electrolyte

In some embodiments, the polishing composition according to the present invention contains an electrolyte. In some embodiments, the electrolyte used herein can be used to grow an average secondary particle size (Z-particle size) of the surface modified silica. The electrolyte can reduce the absolute value of the zeta potential of the particles themselves. Therefore, this has an advantage of reducing the electrostatic repulsion between particles and a polymer, facilitating a reaction with the surface of abrasive grains. Preferably the amount of electrolyte is appropriately adjusted so as to maintain repulsion of the abrasive grains themselves and to avoid aggregation and precipitation. In alternative embodiments, the polishing composition does not contain an electrolyte. In some embodiments, the electrolyte may also serve as a pH adjusting agent.

Lists of electrolytes are provided throughout this application and may be used in the polishing composition. Non-limiting examples of electrolytes for use in the polishing composition include potassium nitrate, sodium chloride, magnesium sulfate, ammonium nitrate, calcium chloride, sodium hydroxide, sodium acetate, magnesium hydroxide, and combinations thereof. In an embodiment, the electrolyte is potassium nitrate.

The electrolyte may be present in an amount from about 0.01 wt % to about 1.5 wt %, from about 0.05 wt % to about 1.25 wt %, or from about 0.1 wt % to about 1.0 wt %. In some embodiments, the amount of electrolyte is present in an amount of at least about 0.01 wt %, at least about 0.025 wt %, at least about 0.05 wt %, at least about 0.1 wt % or at least about 0.5 wt %. In some embodiments, the electrolyte is present in an amount of less than about 1.5 wt %, less than about 1 wt %, or less than about 0.5 wt %. In some embodiments, the electrolyte is present in an amount of about 0.01 wt %, about 0.05 wt %, about 0.1 wt %, about 0.5 wt %, or about 1 wt %. In some embodiments, the electrolyte is present in an amount of less than about 0.84 wt %, less than about 0.8 wt %, less than about 0.5 wt %, less than about 0.1 wt %, less than about 0.05 wt %, less than about 0.01 wt %, or less than about 0.005 wt %. In some embodiments, the composition (or vehicle) does not contain an electrolyte or contains it in such an amount that the electrical conductivity (EC) is less than 0.15 mS/cm, less than 0.1 mS/cm, or less than 0.05 mS/cm.

Silica and Quaternary Ammonium-Based Polymer (Quaternary Ammonium-Based Polymer Molecule)

The polishing compositions comprising the surface modified silica may comprise an amount of silica and quaternary ammonium-based polymer that can be present in specified amounts based on the total weight of the polishing composition. In some embodiments, the silica is present in a concentration from about 0.1 wt % to about 15 wt %, from about 0.3 wt % to about 10 wt %, or about 0.5 wt % to about 7 wt %, based on the total weight of the composition. The preferred content of surface modified silica (final silica concentration) is a final silica concentration of about 5 wt %. In some embodiments, the quaternary ammonium-based polymer is present in a concentration from about 0.01 wt % to about 1.0 wt %, from about 0.02 wt % to about 0.6 wt %, or from about 0.03 wt % to about 0.5 wt %, based on the total weight of the composition. In some embodiments, the silica is present in a concentration from about 1 wt % to about 15 wt %, from about 2 wt % to about 10 wt %, or about 3 wt % to about 7 wt %, based on the total weight of the composition. In some embodiments, the quaternary ammonium-based polymer is present in a concentration from about 0.1 wt % to about 1.0 wt %, from about 0.2 wt % to about 0.6 wt %, or from about 0.3 wt % to about 0.5 wt %, based on the total weight of the composition.

Additional Components

In an embodiment, the polishing compositions disclosed herein may contain additional components such as corrosion inhibitors, oxidizers, polysaccharides, chelating agent, biocides, surfactants, or co-solvents. Additionally or alternatively, the compositions disclosed herein can include other additives as will be understood by those skilled in the art.

In an embodiment, the additional component may include a corrosion inhibitor. Non-limiting examples of the corrosion inhibitor may include 2-methyl-3-butyn-2-ol, 3-methyl-2-pyrazolin-5-one, 8-hydroxyquinoline, and dicyandiamide, benzotriazole and its derivatives, pyrazole and its derivatives, imidazole and its derivatives, benzimidazole and its derivatives, isocyanurate and its derivatives, and mixtures thereof. The amount of corrosion inhibitor in the polishing composition may range from about 0.0005 wt % to 0.25 wt %, preferably from 0.0025 wt % to 0.15 wt %, and more preferably from 0.005 wt % to 0.1 wt % of corrosion inhibitor.

In another embodiment, the additional component may include an oxidizer. Non-limiting examples of the oxidizer include periodic acid, hydrogen peroxide, potassium iodate, potassium permanganate, persulfate salts (e.g., ammonium persulfate and potassium dipersulfate), periodate salts (e.g., potassium periodate), ammonium molybdate, ferric nitrate, nitric acid, potassium nitrate, and mixtures thereof. The amount of oxidizer may range from about 0.1 wt % to about 10 wt %, from about 0.25 wt % to about 5 wt %, or from about 0.5 wt % to about 1.5 wt %.

In another embodiment, the additional component may include a carbohydrate. Non-limiting examples of carbohydrates include modified cellulose ether or complex carbohydrates. In an embodiment, the one or more polysaccharides are selected from the group consisting of hydroxyalkylcelluloses (such as methylhydroxyethyl cellulose (HEMC), methylhydroxypropyl cellulose (HPMC), hydroxyethyl cellulose (HEC), methyl cellulose (MC) and hydroxypropyl cellulose (HPC)), carrageenan, gums (such as xanthan gum, guar gum, karaya gum, carrageenan gum, or pectin), sodium hyaluronate, and pullulan. The amount of carbohydrate may range from about 0.001 wt % to about 0.2 wt %, from about 0.005 wt % to about 0.1 wt %, or from about 0.01 wt % to about 0.05 wt %.

In another embodiment, the additional component may include a chelating agent. The term "chelating agent" is intended to mean any substance that in the presence of an aqueous solution chelates metals, such as copper. Non-limiting examples of chelating agents include inorganic acids, organic acids, amines, and amino acids such as glycine, alanine, citric acid, acetic acid, maleic acid, oxalic acid, malonic acid, phthalic acid, succinic acid, nitrilotriacetic acid, iminodiacetic acid, ethylenediamine, CDTA, and EDTA.

In an embodiment, the additional component may be a biocide. Non-limiting examples of biocides include hydrogen peroxide, quaternary ammonium compounds, and chlorine compounds. More specific examples of the quaternary ammonium compounds include, but are not limited to, methylisothiazolinone, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms. More specific examples of the chlorine compounds include, but are not limited to, sodium chlorite and sodium hypochlorite. Additional examples of biocides include biguanide, aldehydes, ethylene oxide, isothiazolinone, iodophor, KATHON™ and NEOLENE™ product families that are commercially available from Dow chemicals, and the Preventol™ family from Lanxess. The amount of biocide used in the polishing composition may range from about 0.0001 wt % to 0.10 wt %, preferably from 0.0001 wt % to 0.005 wt %, and more preferably from 0.0002 wt % to 0.0025 wt %.

In another embodiment, the additional component may include a surfactant. The surfactants may be anionic, cationic, nonionic, or zwitterionic and may increase lubricity of the vehicle or compositions. Non-limiting examples of the surfactants are dodecyl sulfates, sodium salts or potassium salts, lauryl sulfates, secondary alkane sulfonates, alcohol ethoxylate, acetylenic diol surfactant, quaternary ammonium-based surfactants, amphoteric surfactants, such as betaines and amino acid derivatives-based surfactants, and any combination thereof. Examples of suitable commercially available surfactants include TRITON™, Tergitol™, DOWFAX™ family of surfactants manufactured by Dow Chemicals and various surfactants in SURFYNOL™, DYNOL™, Zetasperse™, Nonidet™, and Tomadol™ surfactant families, manufactured by Air Products and Chemicals.

Suitable surfactants of surfactants may also include polymers comprising ethylene oxide (EO) and propylene oxide (PO) groups. An example of EO-PO polymer is Tetronic™ 90R4 from BASF Chemicals. An example of acetylenic diol surfactant is Dynol™ 607 from Air Products and Chemicals. The amount of surfactant used in the polishing composition may range from about 0.0005 wt % to 0.15 wt %, preferably from 0.001 wt % to 0.05 wt %, and more preferably from 0.0025 wt % to 0.025 wt %.

In another embodiment, the additional component may include a solvent, termed a co-solvent. This co-solvent is present in addition to the dispersing medium described above. Non-limiting examples of co-solvents include, but are not limited to, methanol or ethanol, ethyl acetate, tetrahydrofuran, dimethylformamide, toluene, acetone.

Other non-limiting examples of co-solvents include dimethyl sulfoxide, pyridine, acetonitrile, glycols, and mixtures thereof. The co-solvent may be employed in various amounts, preferably from a lower limit of about 0.0001, 0.001, 0.01, 0.1, 0.5, 1, 5, or 10% (wt %) to an upper limit of about 0.001, 0.01, 0.1, 1, 5, 10, 15, 20, 25, or 35% (wt %).

As described herein, the polishing compositions have specific properties which are greatly influenced by the components in the composition, both in type and amount. Thus, certain materials may need to be excluded from the composition in order to maintain the desired properties.

2. Preparation of Polishing Composition

In some embodiments are provided methods for preparing a polishing composition comprising the surface modified silica and a dispersing medium. The methods for preparing the polishing composition comprise mixing the surface modified silica with the dispersing medium.

The method of mixing is not particularly limited, and for example, it is sufficient that the method is carried out by stirring and mixing the surface modified silica and the dispersing medium. The surface modified silica may be in the form of an aqueous dispersion, and the modified silica abrasive grain solution (silica abrasive grain solution coexisting with quaternary ammonium-based polymer molecules) before being prepared into a polishing composition may also be referred to herein as a vehicle. In some embodiments, the vehicle does not contain a pH adjusting agent. The surface modified silica are prepared in advance of preparing the polishing composition. However, the order for adding the surface modified silica relative to other components in the polishing composition is not particularly limited. Further, the polishing composition can be produced in a state in which aggregation of the surface modified silica is suppressed.

The temperature used when mixing each component is not particularly limited, but it is generally in the range from about 5° C. to about 50° C. In some embodiments, the temperature is in the range from about 10° C. to about 40° C. or from about 20° C. to about 30° C. In some embodiments, the temperature is about 5° C., 10° C., 15° C., 20° C., 25° C., 30° C., 35° C., 40° C., 45° C., or 50° C. Heating may be performed in order to increase the rate of dissolution. The mixing time is not particularly limited, either.

Accordingly, as described herein in some embodiments are polishing compositions, wherein the polishing compositions comprise the surface modified silica disclosed herein and a dispersing medium.

The polishing composition, in some embodiments, may comprise silica (surface modified silica) present in a concentration from about 0.1 wt % to about 15 wt %, from about 0.5 wt % to about 10 wt %, or from about 1.0 wt % to about 5 wt %, based on the total weight of the composition. The polishing composition, in some embodiments, may comprise silica (surface modified silica) present in a concentration from about 1 wt % to about 15 wt %, from about 1.5 wt % to about 10 wt %, or from about 2 wt % to about 5 wt %, based on the total weight of the composition. In some embodiments, the amount of silica may be about 0.1 wt % or more, about 0.3 wt % or more, about 0.5 wt % or more, about 1 wt % or more, about 2 wt % or more, about 3 wt % or more, about 4 wt % or more, or about 10 wt % or more, based on the total weight of the composition. In other embodiments, the amount of silica is less than about 15 wt %, less than about 10 wt %, less than about 6 wt %, less than about 5 wt %, less than about 4 wt %, or less than about 3 wt %, based on the total weight of the composition. Incidentally, the description of these embodiments is also applicable to the C-2. Polishing Composition (Another Embodiment). The following embodiments may be applied in the same manner.

The polishing composition, in some embodiments, may comprise quaternary ammonium-based polymer present in a concentration from about 0.01 wt % to about 1.0 wt %, from about 0.05 wt % to about 0.8 wt %, from about 0.1 wt % to about 0.6 wt %, or from about 0.15 wt % to about 0.40 wt %, based on the total weight of the composition.

The polishing composition, in some embodiments, may comprise quaternary ammonium-based polymer present in a concentration from about 0.02 wt % to about 1.0 wt %, from about 0.1 wt % to about 0.8 wt %, from about 0.2 wt % to about 0.6 wt %, or from about 0.25 wt % to about 0.40 wt %, based on the total weight of the composition. In some embodiments, the amount of quaternary ammonium-based polymer may be about 0.01 wt % or more, about 0.02 wt % or more, about 0.1 wt % or more, about 0.2 wt % or more, about 0.4 wt % or more, or about 0.6 wt % or more, based on the total weight of the composition. In other embodiments, the amount of quaternary ammonium-based polymer is less than about 1.0 wt %, less than about 0.7 wt %, less than about 0.5 wt %, less than about 0.4 wt %, or less than about 0.25 wt %, based on the total weight of the composition.

The polishing compositions may have an associated electrical conductivity (EC). The electrical conductivity for the polishing compositions described herein is from greater than zero to about 1.0 mS/cm. In some embodiments, the electrical conductivity is from greater than zero to about 0.75 mS/cm, from greater than zero to about 0.50 mS/cm, from greater than zero to about 0.25 mS/cm, from greater than zero to about 0.15 mS/cm, from greater than zero to about 0.10 mS/cm, from greater than zero to about 0.05 mS/cm, or from greater than zero to about 0.03 mS/cm. In some embodiments, the electrical conductivity is from about 0.01 mS/cm to about 1.0 mS/cm, from about 0.02 mS/cm to about 0.50 mS/cm, or from about 0.03 mS/cm to about 0.1 mS/cm. In some embodiments, the electrical conductivity is about 0.02, 0.03, 0.04, 0.05, 0.06, 0.07, 0.08, 0.09, 0.10, 0.11, 0.12, 0.13, 0.14, or 0.15 mS/cm. In some embodiments, the upper limit of the electrical conductivity is about 0.25 mS/cm, about 0.20 mS/cm, about 0.18 mS/cm, about 0.16 mS/cm, about 0.14 mS/cm, about 0.12 mS/cm, about 0.10 mS/cm, about 0.08 mS/cm, about 0.07 mS/cm, about 0.06 mS/cm, about 0.05 mS/cm, about 0.04 mS/cm, or about 0.03 mS/cm.

The polishing compositions may have an associated zeta potential. The zeta potential may be positive or negative. In an embodiment, the polishing composition has a positive zeta potential. For example, in some embodiments the zeta potential is equal to, or greater than, +30 mV for a pH range from 3 to 10. Further, the more the content of quaternary ammonium-based surface-modified silica present in the polishing composition, extends a pH range where the zeta potential will remain positive to a higher pH range.

The positive zeta potential may be in the range from about 10 mV to about 90 mV, from about 20 mV to about 80 mV, from about 30 mV to about 70 mV, or from about 40 mV to about 60 mV. In some embodiments, the zeta potential is about 30 mV, about 35 mV, about 40 mV, about 45 mV, about 50 mV, about 55 mV, about 60 mV, about 65 mV, or about 70 mV. In some embodiments, the zeta potential is greater than about 20 mV, greater than about 30 mV, greater than about 40 mV, or greater than about 50 mV.

C-2. Polishing Compositions (Another Embodiment)

As another embodiment, a polishing composition comprising silica particles and quaternary ammonium-based polymer molecules, wherein a ratio ($N^+/N^-$) is 500 or greater, is included.

The silica particles coexisting with the quaternary ammonium-based polymer molecules in the composition (in some cases, this may be read as "to be coexisted", and the same applies herein.) may have an average secondary particle size of about 10 nm or more, about 25 nm or more, about 50 nm or more, about 60 nm or more, or about 70 nm or more. Alternatively, or in addition, the silica particles may have an average secondary particle size of about 500 nm or less, about 200 nm or less, about 150 nm or less, about 100 nm or less, about 90 nm or less, about 80 nm or less, about 70 nm or less, or about 60 nm or less. For example, in an embodiment, the silica particles may have an average secondary particle size in the range from about 10 nm to about 500 nm, from about 25 nm to about 250 nm, from about 50 nm to about 100 nm, or from about 60 nm to about 80 nm. In some embodiments, the average secondary particle size is about 50 nm, about 60 nm, about 70 nm, about 80 nm, or about 90 nm.

Preferred embodiments for secondary particle size ranges include a range from about 50 nm to about 100 nm, or from about 60 nm to about 80 nm. A more preferred range is from about 60 nm to about 80 nm. When the average secondary particle size is within this preferred range, surface defects such as scratches on a surface of a substrate can be suppressed.

The average secondary particle size of silica particles coexisting (to be coexisted) with quaternary ammonium-based polymer molecules in the composition can be measured by dynamic light scattering (DLS). As used herein, the average secondary particle size is also referred to as "z-avg size."

In the particle size distribution analysis by the dynamic light scattering method, the polydispersity index (PDI) is another measurement that is widely used. As a general description, the larger the values for the PDI, the larger the size distribution of the particle size. Accordingly, lower values for PDI are preferred. In some embodiments, the PDI for the silica particles coexisting with quaternary ammonium-based polymer molecules in the composition is in a range from about 0 to about 0.20, from about 0 to about 0.10, or from about 0 to about 0.05. Alternatively, the PDI is in a range from about 0.01 to about 0.20, from about 0.025 to about 0.15, or from about 0.05 to about 0.10. In some embodiments, the PDI is less than about 0.15, less than about 0.10, less than about 0.75, less than about 0.70, or less than about 0.50. In some embodiments, the polydispersity index (PDI) may employ a value measured by a Zetasizer manufactured by Malvern Panalytical Ltd.

Silica particles coexisting with quaternary ammonium-based polymer molecules in a composition have a permanent positive charge. The charge on such particles is commonly referred to in the art as a zeta potential (or the electrokinetic potential). The zeta potential of a particle refers to an electrical potential difference between an electrical charge of ions surrounding the particle and the electrical charge of bulk solution of a polishing composition (e.g., a liquid carrier and any other components dissolved therein).

Incidentally, for the specific description of quaternary ammonium-based polymer (quaternary ammonium-based polymer molecules), the aforementioned description can be applied in the same manner.

Accordingly, the silica coexisting with the quaternary ammonium-based polymer molecules in the composition has an associated zeta potential. In an embodiment, the silica coexisting with the quaternary ammonium-based polymer molecules in the composition has a positive zeta potential. In some embodiments, the silica coexisting with the quaternary ammonium-based polymer molecules has a positive zeta potential when it is in the polishing composition. The positive zeta potential may be in a range from about 10 mV to about 90 mV, from about 20 mV to about 80 mV, about 30 mV to about 70 mV, or about 40 mV to about 60 mV. In some embodiments, the zeta potential is about 30 mV, about 35 mV, about 40 mV, about 45 mV, about 50 mV, about 55 mV, about 60 mV, about 65 mV, or about 70 mV. In some embodiments, the zeta potential is greater than about 20 mV, greater than about 30 mV, greater than about 40 mV, or greater than about 50 mV. In some embodiments, the zeta potential may employ a value measured with a Zetasizer manufactured by Malvern Panalytical Ltd.

The silica coexisting with quaternary ammonium-based polymer molecules in the composition may have an associated electrical conductivity (EC). The electrical conductivity of silica coexisting with quaternary ammonium-based polymer molecules in the composition is from greater than zero to about 1.0 mS/cm. In some embodiments, the electrical conductivity is from greater than zero to about 0.75 mS/cm, from greater than zero to about 0.50 mS/cm, from greater than zero to about 0.25 mS/cm, from greater than zero to about 0.15 mS/cm, from greater than zero to about 0.10 mS/cm, from greater than zero to about 0.05 mS/cm, or from greater than zero to about 0.03 mS/cm. In some embodiments, the electrical conductivity is from about 0.01 mS/cm to about 1.0 mS/cm, from about 0.02 mS/cm to about 0.50 mS/cm, or from about 0.03 mS/cm to about 0.1 mS/cm. In some embodiments, the electrical conductivity is about 0.02, 0.03, 0.04, 0.05, 0.06, 0.07, 0.08, 0.09, 0.10, 0.11, 0.12, 0.13, 0.14, or 0.15 mS/cm. In some embodiments, the upper limit of the electrical conductivity is about 0.25 mS/cm, about 0.20 mS/cm, about 0.18 mS/cm, about 0.16 mS/cm, about 0.14 mS/cm, about 0.12 mS/cm, about 0.10 mS/cm, about 0.08 mS/cm, about 0.07 mS/cm, about 0.06 mS/cm, about 0.05 mS/cm, about 0.04 mS/cm, or about 0.03 mS/cm. In some embodiments, the electrical conductivity may employ a value measured with an Orion Star A212 manufactured by Thermo Fisher Scientific, Inc.

In some embodiments, the silica coexisting with the quaternary ammonium-based polymer molecules in the composition is present in a concentration from about 1 wt % to about 15 wt %, from about 2 wt % to about 10 wt %, or from about 3 wt % to about 7 wt %, based on the total weight of the composition. The preferred content of silica coexisting with quaternary ammonium-based polymer molecules in the composition (final silica concentration) is a final silica concentration of about 5 wt %.

The silica particles coexisting with the quaternary ammonium-based polymer molecules in the composition may be further characterized by the relationship between the quaternary ammonium-based polymer molecules relative to the silica particles. This relationship is represented herein as ($N^+/N^-$). The higher this number indicates a more complete coating of the silica particle.

Accordingly, in some embodiments, the $N^+/N^-$ value is about 500 or greater, greater than about 500, greater than about 1,000, greater than about 2,000, greater than about 3,000, greater than about 4,000, greater than about 5,000, greater than about 6,000, or greater than about 7,000. In alternate embodiments, the $N^+/N^-$ value is about 500, about 1,000, about 2,500, about 5,000, or about 7,000.

A method for preparing the polishing composition in another embodiment comprises the step of mixing the dispersion containing silica and a dispersing medium, and an aqueous solution of the quaternary ammonium-based polymer. This step may be preliminarily carried out before preparation as a polishing composition by further containing other components such as a pH adjusting agent.

In this step, a dispersion comprising silica, the quaternary ammonium-based polymer, and the dispersing medium may be mixed at a speed of about 300 RPM or higher or about 500 RPM or higher, for example, a $N^+/N^-$ value may be appropriately set to about 500 or greater, and the same steps described in METHODS FOR MAKING THE SURFACE MODIFIED SILICA may be performed. In some embodiments, the lower limit of the mixing speed is favorably about 200 RPM or higher, about 250 RPM or higher, or about 300 RPM or higher. The upper limit thereof is favorably about 500 RPM or lower, about 450 RPM or lower, or about 400 RPM or lower. The upper limit may be below about 500 rpm, below about 450 rpm, or below about 400 rpm. In some embodiments, the $N^+/N^-$ value is about 500 or greater, greater than about 500, greater than about 1,000, greater than about 2,000, greater than about 3,000, greater than about 4,000, greater than about 5,000, greater than about 6,000, or greater than about 7,000. In alternate embodiments, the $N^+/N^-$ value is about 500, about 1,000, about 2,500, about 5,000, or about 7,000.

For other descriptions of the polishing composition in C-2, the description in C-1. Polishing Composition can be applied as ordinarily understood by those skilled in the art, such as by appropriately replacing the surface modified silica with silica if necessary.

D. Polishing Method

In an embodiment, the polishing compositions described herein are useful for polishing any suitable substrate. Suitable substrates include, but are not limited to, flat panel displays, integrated circuits, memory or rigid disks, metals, interlayer dielectric (ILD) devices, semiconductors, micro-electro-mechanical systems, ferroelectrics, and magnetic heads.

The polishing method will include using a polishing apparatus. The polishing apparatus is not particularly limited. In general, the polishing apparatus has a holder for holding a substrate or an object to be polished, a moveable polishing head, a motor having a changeable rotation speed, and a polishing plate to which a polishing pad (or polishing cloth) can be attached.

Polishing conditions are not particularly limited. For example, the rotation speed of the polishing plate and head are each, independently, from 10 to 500 rpm. The polishing pad and/or polishing head will be applied to the substrate at a specific pressure, which is preferably from 0.5 to 10 psi. The method for supplying the polishing composition to the polishing pad is not particularly limited. For example, the polishing composition may be supplied continuously using a pump or the like. The supply amount is not limited, but the surface of the polishing pad is preferably continuously covered with the polishing composition.

In the method of polishing a substrate, the polishing compositions disclosed herein have a material removal rate of at least about 100 Å/min; at least about 150 Å/min; at least about 180 Å/min; at least about 200 Å/min; at least about 250 Å/min; at least about 300 Å/min; or at least about 500 Å/min. In some embodiments, the material removal rate is in a range from about 100 Å/min to about 500 Å/min; from about 150 Å/min to about 300 Å/min; or from about 180 Å/min to about 250 Å/min. In some embodiments, the material removal rate is about 100 Å/min, about 150 Å/min, about 180 Å/min, about 200 Å/min, about 250 Å/min, or about 300 Å/min.

Accordingly, as described herein in some embodiments are methods of polishing a substrate, the method comprising the steps of: a) providing the polishing composition containing the surface modified silica; and b) polishing the substrate with the polishing composition to provide a polished substrate.

As in any embodiment above, a method wherein the substrate is a semiconductor, is provided.

As in any embodiment above, a method which results in an oxide removal rate of at least about 500 Å/min, is provided.

In performing the polishing method disclosed herein, which comprises use of the surface-modified silica which has been surface-modified by a quaternary ammonium-based polymer, improvements are observed when compared to known methods. For example, in an embodiment, a higher removal rate was observed for materials (i.e., substrates) which have a negative zeta potential. For example, $SiO_2$ has a zeta potential of −30 mV at pH=7. In this case, there is an attractive force between the abrasive (i.e., surface-modified silica) and the wafer. Specifically, this effect is also applicable to many CMP materials (such as SiN, SoC, W, Cu, Ta, Co . . . etc.).

E. Examples

The following preparations and examples are given to enable those skilled in the art to more clearly understand and to practice the present invention. They should not be considered as limiting the scope of the invention, but merely as being illustrative and representative.

In one aspect, disclosed are methods of making the surface modified silica. In another aspect are disclosed methods of using polishing compositions comprising the surface modified silica in order to polish materials.

Example 1: Surface Modified Silica Examples

A surface modified silica enabling a high zeta potential with minimal change in average secondary particle size was identified. More specifically, in some embodiments, 2 to 5 wt % $SiO_2$ materials can be made with minimal change in average secondary particle size and about +50 mV zeta potential. In further embodiments, low amounts of electrolyte can be used to grow the particle size.

Furthermore specifically, a dispersion containing silica (silica particles) and dispersing medium (z-avg size of silica (nm): 70 nm) was provided, and then mixed with the aqueous solution of quaternary ammonium-based polymer shown in Table 1 with an Ultra Turrax, 18G rotor/stator at 300 RPM, then to make a modified silica abrasive grain solution (silica abrasive grain solution coexisting with quaternary ammonium-based polymer molecules) (vehicle). Thereafter, a dispersing medium (water) and potassium nitrate in Table 1 were optionally added, and mixed by an Ultra Turrax, 18G rotor/stator at 300 RPM to make the composition having the composition of Table 1. Using the measurement methods specified in the specification, the z-avg size, PDI, and zeta potential (mV) of the silica (modified silica) in each composition, as well as the EC (mS/cm) of the composition were measured, and are shown in Table 2.

TABLE 1

| | | | Surface modified silica | | | | |
|---|---|---|---|---|---|---|---|
| Comp # | Polymer Name | Polymer MW | Silica Particle | Polymer (wt %) | $KNO_3$ (wt %) | $SiO_2$ (wt %) | pH |
| 1 | PDADMAC | 100,000 | PL-3 | 0.67% | 0% | 7.18% | 7.5 |
| 2 | PDADMAC | 100,000 | PL-3 | 0.67% | 1.28% | 7.18% | 7.5 |
| 3 | POEDMIED2C | 5,000 | PL-3 | 0.02% | 0% | 6.19% | 7.5 |
| 4 | POEDMIED2C | 5,000 | PL-3 | 0.02% | 0.67% | 6.19% | 7.5 |

TABLE 1-continued

| | | | Surface modified silica | | | | |
|---|---|---|---|---|---|---|---|
| Comp # | Polymer Name | Polymer MW | Silica Particle | Polymer (wt %) | KNO₃ (wt %) | SiO₂ (wt %) | pH |
| 5 | POEDMIED2C | 5,000 | PL-3 | 0.23% | 0% | 2.60% | 7.5 |
| 6 | POEDMIED2C | 5,000 | PL-3 | 0.23% | 0.84% | 2.60% | 7.5 |
| 7 | POEDMIED2C | 5,000 | PL-3 | 0.40% | 0% | 4.60% | 7.5 |
| 5-1 | POEDMIED2C | 5,000 | PL-3 | 0.23% | 0% | 2.60% | 3.0 |
| 5-2 | POEDMIED2C | 5,000 | PL-3 | 0.23% | 0% | 2.60% | 10 |
| 7-1 | POEDMIED2C | 5,000 | PL-3 | 0.40% | 0% | 4.60% | 3.0 |
| 7-2 | POEDMIED2C | 5,000 | PL-3 | 0.40% | 0% | 4.60% | 10 |

\* The wt % in the table is a concentration in the composition.
\* PL-3: Colloidal silica manufactured by Fuso Chemical Co., Ltd.
\* Nitric acid is used for 5-1 and 7-1, and KOH is used for 5-2 and 7-2.

TABLE 2

| | | Associated Properties of the Surface Modified Silica | | | |
|---|---|---|---|---|---|
| Comp # | N⁺/N⁻ | z-avg size (nm) | PDI | zeta potential (mV) | EC (mS/cm) |
| 1 | 411 | 158 | 0.258 | N.D. | N.D. |
| 2 | 411 | 272 | 0.186 | N.D. | N.D. |
| 3 | 284 | 4113 | 0.199 | N.D. | N.D. |
| 4 | 284 | 3601 | 0.216 | N.D. | N.D. |
| 5 | 7785 | 77 | 0.091 | 54.2 | 0.03 |
| 6 | 7785 | 530 | 0.285 | 36.5 | 0.15 |
| 7 | 7652 | 74.5 | 0.051 | 51 | 0.03 |
| 5-1 | 7785 | 77.3 | 0.099 | 41.2 | 0.06 |
| 5-2 | 7785 | 76.3 | 0.101 | 55.9 | 0.05 |
| 7-1 | 7652 | 77.4 | 0.066 | 42.3 | 0.06 |
| 7-2 | 7652 | 76.3 | 0.087 | 55.4 | 0.05 |

POEDMIED2C is defined herein. PDADMAC has the following chemical structure:

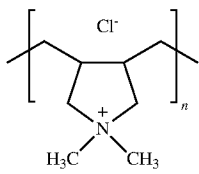

[Formula 6]

It is noted that the value of N⁺/N⁻ is obtained by the following formula:

$$= \frac{\text{Polymer Conc. [wt \%]} * \text{index [g/mol]}}{\text{Polymer MW} \left[\frac{g}{mol}\right] * \text{Silica Conc [wt \%]}}$$

[Math. 1]

index: $=4.4 \times 10^8$ g/mol

Example 2: Procedure for Preparing Surface Modified Silica

Surface modification of the silica may be performed by mixing a polymer containing solution with a suspension comprising silica. Mixing of additives, etc., while pumping the solution (in-situ mixing) is the preferred method for high-volume processing, but mixing may also be accomplished by rotor/stator method, blade stirring, or by pouring one liquid into the other followed by pouring the mixture back and forth between two vessels. The polymer containing solution may be a polymer aqueous solution.

A suspension of the particles is mixed with a solution of the polymer in order to treat the particles with the quaternary ammonium-based polymer. The particles are silica particles. The polymer solution may be an aqueous polymer solution. The lower limit of the speed of mixing in the solution comprising the suspension of particles and the polymer (polymer solution) is favorably about 200 RPM or higher, about 250 RPM or higher, or about 300 RPM or higher. The upper limit is thereof favorably about 500 RPM or lower, about 450 RPM or lower, or about 400 RPM or lower. Mixing may be performed by methods known in the art, such as with an Ultra Turrax, 18G rotor/stator, at about 250 RPM or higher. In some embodiments, the speed of mixing of the solution comprising the suspension of the particles and the polymer (polymer solution) may be from 250 to 500 RPM.

It will be apparent to those skilled in the art that various modifications and variations can be made in the present invention without departing from the scope or spirit of the invention. Other aspects of the invention will be apparent to those skilled in the art from consideration of the specification and practice of the invention disclosed herein. It is intended that the specification and examples be considered as exemplary only, with a true scope and spirit of the invention being indicated by the following claims. The entire disclosure of the U.S. provisional patent application No. 63/168,789, filed on Mar. 31, 2021, is incorporated herein by reference in its entirety.

What is claimed is:

1. A surface modified silica comprising silica and a quaternary ammonium-based polymer, wherein the quaternary ammonium-based polymer is represented by a compound of Formula (I):

[Formula 1]

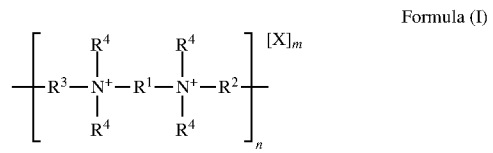

Formula (I)

wherein
R¹ is selected from substituted or unsubstituted C1-C8 alkylene, substituted or unsubstituted arylene, substituted heteroarylene, and substituted cycloalkylene,
R² is selected from substituted or unsubstituted C1-C8 alkylene, substituted or unsubstituted arylene, substituted heteroarylene, and substituted cycloalkylene, R³ is a substituted or unsubstituted oxyalkylene,
R⁴ is, in each instance, a substituted or unsubstituted C1-C8 alkyl,
X is, in each instance, a counterion,
m is an integer between 1 and 20,000, and
n is an integer between 1 and 10,000;
wherein the surface modified silica has an $N^+/N^-$ value greater than about 3,000.

2. The surface modified silica of claim 1, wherein X is, in each instance, selected from the group consisting of hydroxide, halide, nitrate, carbonate, sulfate, phosphate, and acetate.

3. The surface modified silica of claim 1, wherein $R^1$ and $R^2$ are, in each instance, a substituted or unsubstituted C1-C8 alkylene, and $R^4$ is, in each instance, a substituted or unsubstituted C1-C8 alkyl.

4. The surface modified silica of claim 3, wherein $R^1$ and $R^2$ are, in each instance an unsubstituted C1-C4 alkylene, and $R^4$ is, in each instance, an unsubstituted C1-C4 alkyl.

5. The surface modified silica of claim 1, wherein $R^3$ is an unsubstituted oxyalkylene.

6. The surface modified silica claim 1, wherein the quaternary ammonium-based polymer has a molecular weight between about 2,000 g/mol and about 15,000 g/mol.

7. The surface modified silica of claim 1, wherein the surface modified silica has an average secondary particle size between about 60 nm and about 80 nm.

8. The surface modified silica of claim 1, wherein the surface modified silica has a polydispersity index of about 0.07 or less.

9. The surface modified silica of claim 1, wherein the surface modified silica has a zeta potential between about 30 mV and about 70 mV.

10. A polishing composition, wherein the polishing composition comprises the surface modified silica of claim 1 and a dispersing medium.

11. The polishing composition of claim 10, wherein the quaternary ammonium-based polymer is present in a concentration from about 0.2% to about 0.6%, based on the total weight of the composition.

12. The polishing composition of claim 10, wherein the polishing composition has a pH of about 5 to about 9.

13. The polishing composition of claim 12, further comprising a pH adjusting agent.

14. A method for polishing a substrate, the method comprising the steps of
a) preparing the polishing composition of claim 10, and
b) polishing the substrate with the polishing composition to provide a polished substrate.

15. The surface modified silica of claim 1, wherein the surface modified silica is comprised in a polishing composition and the quaternary ammonium-based polymer is present in a concentration from about 0.2 wt % to about 0.6 wt %, based on the total weight of the polishing composition.

* * * * *